(12) United States Patent
Mizutani

(10) Patent No.: US 11,198,816 B2
(45) Date of Patent: *Dec. 14, 2021

(54) ETCHING COMPOSITIONS

(71) Applicant: Fujifilm Electronic Materials U.S.A., Inc., N. Kingstown, RI (US)

(72) Inventor: Atsushi Mizutani, Shizuoka (JP)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/114,844

(22) Filed: Dec. 8, 2020

(65) Prior Publication Data

US 2021/0087467 A1   Mar. 25, 2021

Related U.S. Application Data

(63) Continuation of application No. 16/162,440, filed on Oct. 17, 2018, now Pat. No. 10,889,757.

(60) Provisional application No. 62/574,279, filed on Oct. 19, 2017.

(51) Int. Cl.
   *C09K 13/08*  (2006.01)
   *C09K 13/06*  (2006.01)
   *H01L 21/311* (2006.01)

(52) U.S. Cl.
   CPC .............. *C09K 13/08* (2013.01); *C09K 13/06* (2013.01); *H01L 21/31111* (2013.01)

(58) Field of Classification Search
   None
   See application file for complete search history.

(56) References Cited

U.S. PATENT DOCUMENTS

| | | |
|---|---|---|
| 7,479,474 B2 | 1/2009 | Cernat et al. |
| 2002/0020833 A1 | 2/2002 | Zhang et al. |
| 2005/0014667 A1 | 1/2005 | Aoyama et al. |
| 2008/0041823 A1 | 2/2008 | La et al. |
| 2008/0261847 A1 | 10/2008 | Visintin et al. |
| 2010/0015804 A1 | 1/2010 | Sharma |
| 2010/0015807 A1 | 1/2010 | Kim et al. |
| 2013/0296214 A1 | 11/2013 | Barnes et al. |
| 2014/0038420 A1 | 2/2014 | Chen et al. |
| 2014/0235064 A1 | 8/2014 | Matsui et al. |
| 2015/0247087 A1 | 9/2015 | Kamimura et al. |
| 2015/0267112 A1 | 9/2015 | Dory et al. |
| 2016/0056054 A1 | 2/2016 | Takahashi et al. |
| 2016/0079078 A1 | 3/2016 | Asano |
| 2016/0185595 A1 | 6/2016 | Chen et al. |
| 2017/0145311 A1 | 5/2017 | Liu et al. |
| 2019/0119571 A1 | 4/2019 | Mizutani |

FOREIGN PATENT DOCUMENTS

| | | | |
|---|---|---|---|
| CN | 1738928 | 2/2006 | ................ C23F 3/06 |
| CN | 1802731 | 7/2006 | ........... H01L 21/306 |
| CN | 102225874 | 10/2011 | .............. C04B 41/91 |
| CN | 105304485 | 2/2016 | ......... H01L 21/3213 |
| CN | 105633170 | 6/2016 | ........... H01L 29/786 |
| CN | 106460196 | 2/2017 | ................ C23F 1/10 |
| DE | 2141235 | 3/1973 | |
| JP | H 07-286172 | 10/1995 | ............. C09K 13/06 |
| WO | WO 2008/157345 | 12/2008 | |
| WO | WO 2012/154498 | 11/2012 | |

OTHER PUBLICATIONS

Office Action from the Chinese Patent Office for Application No. CN 201880067737.1, dated Feb. 23, 2021 (With English machine translation).

The International Preliminary Report on Patentability for International Application No. PCT/US2018/056439 dated Apr. 30, 2020.

The International Search Report and the Written Opinion of the International Searching Authority for International Application No. PCT/US2018/056439 dated Dec. 21, 2018.

Supplementary European Search Report for European Application No. EP 18 86 8893, dated Oct. 16, 2020.

Communication from the European Patent Offfice for Application No. EP 18 868 893.1 by Examiner Dominguez Gutierrez dated Sep. 23, 2021.

*Primary Examiner* — Shamim Ahmed

(74) *Attorney, Agent, or Firm* — Fish & Richardson P.C.

(57) ABSTRACT

The present disclosure is directed to etching compositions that are useful, e.g., for selectively removing tantalum (Ta) and/or tantalum nitride (TaN) from a semiconductor substrate as an intermediate step in a multistep semiconductor manufacturing process.

27 Claims, No Drawings

ETCHING COMPOSITIONS

CROSS-REFERENCE TO RELATED APPLICATIONS

The present application is a continuation of U.S. Utility application Ser. No. 16/162,440, filed on Oct. 17, 2018, which claims priority to U.S. Provisional Application Ser. No. 62/574,279, filed on Oct. 19, 2017. The contents of the parent applications are hereby incorporated by reference in their entirety.

FIELD OF THE DISCLOSURE

The present disclosure relates to compositions and processes to selectively etch tantalum and/or tantalum nitride in the presence of other exposed or underlying materials, such as metal conductors (e.g., copper), barrier materials, insulator materials (e.g., low-k dielectric materials).

BACKGROUND OF THE DISCLOSURE

The semiconductor industry is rapidly decreasing the dimensions and increasing the density of electronic circuitry and electronic components in microelectronic devices, silicon chips, liquid crystal displays, MEMS (Micro Electro Mechanical Systems), printed wiring boards, and the like. The integrated circuits within them are being layered or stacked with constantly decreasing thicknesses of the insulating layer between each circuitry layer and smaller and smaller feature sizes. As the feature sizes have shrunk, patterns have become smaller, and device performance parameters tighter and more robust. As a result, various issues which heretofore could be tolerated, can no longer be tolerated or have become more of an issue due to the smaller feature size.

In the production of advanced integrated circuits, to minimize problems associated with the higher density and to optimize performance, both high k and low k insulators, and assorted barrier layer materials have been employed.

Tantalum (Ta) and tantalum nitride (TaN) are utilized for semiconductor devices, liquid crystal displays, MEMS (Micro Electro Mechanical Systems), printed wiring boards and the like, and as ground layers and cap layers for precious metal, aluminum (Al) and copper (Cu) wiring. In semiconductor devices, it may be used as a barrier metal, a hard mask, or a gate material.

In the construction of devices for these applications, Ta and TaN frequently need to be etched. In the various types of uses and device environments of Ta and TaN, other layers are in contact with or otherwise exposed at the same time as these two materials are etched. Highly selective etching of the Ta and TaN in the presence of these other materials (e.g. metal conductors, dielectric, and hard marks) is required for device yield and long life. The etching process for the Ta and TaN may be a plasma etching process. However, using a plasma etching process on the Ta or TaN layer may cause damage to either or both the gate insulating layer and the semiconductor substrate. In addition, the etching process may remove a portion of the semiconductor substrate by etching the gate insulating layer exposed by the gate electrode. The electrical characteristics of the transistor may be negatively impacted. To avoid such etching damage, additional protective device manufacturing steps may be employed, but at a significant cost.

Wet etching methods for Ta and TaN are known. Such methods may include use of etchants in combination with other reagents. However, the selectivity with silicon based dielectrics and metals (e.g., Cu) is not sufficient and other exposed metals in the device may also undergo corrosion or etching.

Thus, there is a need for etching solutions that have high Ta or TaN etch rate, but have low etch and corrosion rates for other semiconductor materials which are exposed or in contact with the Ta or TaN during the etching process.

SUMMARY OF THE DISCLOSURE

The present disclosure relates to compositions and processes for selectively etching Ta and/or TaN relative to metal conductor layers, hard mask layers and low-k dielectric layers that are present in the semiconductor device. More specifically, the present disclosure relates to compositions and processes for selectively etching Ta and/or TaN relative to copper and low-k dielectric layers.

In one aspect, the disclosure features an etching composition that includes a) hydrofluoric acid; b) at least one first solvent including a carboxylic acid; c) at least one oxidizing agent; and d) at least one complexing agent selected from the group consisting of polycarboxylic acids and hydroxycarboxylic acids.

In another aspect, the disclosure features an etching composition that includes a) hydrofluoric acid; b) at least one first solvent comprising a carboxylic acid; and c) at least one complexing agent selected from the group consisting of polycarboxylic acids and hydroxycarboxylic acids.

In another aspect, the disclosure features a method that includes contacting a semiconductor substrate containing Ta and/or TaN with an etching composition described herein to remove the Ta and/or TaN.

In still another aspect, the disclosure features an article formed by the method described above, in which the article is a semiconductor device (e.g., an integrated circuit).

DETAILED DESCRIPTION OF THE DISCLOSURE

As defined herein, unless otherwise noted, all percentages expressed should be understood to be percentages by weight to the total weight of the composition. Unless otherwise noted, ambient temperature is defined to be between about 16 and about 27 degrees Celsius (° C.).

In general, the disclosure features an etching composition (e.g., an etching composition for selectively removing tantalum and/or tantalum nitride) that includes a) hydrofluoric acid (HF); b) at least one first solvent, the first solvent being a carboxylic acid; c) at least one oxidizing agent; and d) at least one complexing agent selected from the group consisting of polycarboxylic acids and hydroxycarboxylic acids.

In some embodiments, the hydrofluoric acid is in an amount of at least about 0.1 wt % (e.g., at least about 0.2 wt %, at least about 0.4 wt %, at least about 0.5 wt %, at least about 0.6 wt %, at least about 0.8 wt %, at least about 1 wt %, at least about 1.2 wt %, at least about 1.4 wt %, or at least about 1.5 wt %) to at most about 5 wt % (e.g., at most about 4.5 wt %, at most about 4 wt %, at most about 3.5 wt %, at most about 3 wt %, at most about 2.5 wt %, or at most about 2 wt %) of the etching composition of this disclosure. Without wishing to be bound by theory, it is believed that hydrofluoric acid can facilitate and enhance the removal of Ta and/or TaN on a semiconductor substrate during the etching process.

The etching composition of this disclosure can optionally include any oxidizing agent suitable for use in microelectronic applications. Examples of suitable oxidizing agents include, but are not limited to, oxidizing acids or salts thereof (e.g., nitric acid, permanganic acid, or potassium permanganate), peroxides (e.g., hydrogen peroxide, dialkylperoxides, urea hydrogen peroxide), persulfonic acid (e.g., hexafluoropropanepersulfonic acid, methanepersulfonic acid, trifluoromethanepersulfonic acid, or p-toluenepersulfonic acid) and salts thereof, ozone, percarbonic acids (e.g., peracetic acid) and salts thereof, perphosphoric acid and salts thereof, persulfuric acid and salts thereof (e.g., ammonium persulfate or tetramethylammonium persulfate), perchloric acid and salts thereof (e.g., ammonium perchlorate, sodium perchlorate, or tetramethylammonium perchlorate)), and periodic acid and salts thereof (e.g., periodic acid, ammonium periodate, or tetramethylammonium periodate). These oxidizing agents can be used singly or in combination.

In some embodiments, the oxidizing agent can be from at least about 0.01% by weight (e.g., at least about 0.02% by weight, at least about 0.04% by weight, at least about 0.05% by weight, at least about 0.06% by weight, at least about 0.08% by weight, at least about 0.1% by weight, at least about 0.15% by weight, or at least about 0.2% by weight) to at most about 0.5% by weight (e.g., at most about 0.45 wt %, at most about 0.4 wt %, at most about 0.35 wt %, at most about 0.3 wt %, at most about 0.25 wt %, or at most about 0.2 wt %) of the etching composition of this disclosure. Without wishing to be bound by theory, it is believed that the oxidizing agent can facilitate and enhance the removal of Ta and/or TaN on a semiconductor substrate.

In some embodiments, the etching composition of this disclosure can exclude an oxidizing agent (e.g., nitric acid). In such embodiments, the etching composition may still be able to selectively etching Ta and/or TaN relative to other materials (e.g., metal conductor layers, hard mask layers and low-k dielectric layers) in a patterned semiconductor substrate (e.g., a patterned wafer).

In general, the etching composition of this disclosure can include any suitable complexing agent. In some embodiments, the complexing agent can be selected from the group consisting of polycarboxylic acids and hydroxycarboxylic acids. As used herein, the term "polycarboxylic acid" refers a compound containing two or more (e.g., two, three, or four) carboxyl groups (COOH). Examples of suitable polycarboxylic acids include oxalic acid, malonic acid, succinic acid, glutaric acid, and adipic acid. As used herein, the term "hydroxycarboxylic acid" refers to compounds containing at least one (e.g., two, three, or four) hydroxyl group (OH) and at least one (e.g., two, three, or four) carboxyl groups (COOH). Examples of suitable hydroxycarboxylic acids include citric acid and 2-hydroxybenzoic acid. In some embodiments, the polycarboxylic acid includes no hydroxyl group. In some embodiments, the hydroxycarboxylic acid includes only one hydroxyl group.

In some embodiments, the complexing agent can be from at least about 0.1% by weight (e.g., at least about 0.2% by weight, at least about 0.4% by weight, at least about 0.5% by weight, at least about 0.6% by weight, at least about 0.8% by weight, at least about 1% by weight, at least about 1.5% by weight, at least about 2% by weight, at least about 2.5% by weight, or at least about 5% by weight) to at most about 10% by weight (e.g., at most about 9.5 wt %, at most about 9 wt %, at most about 8.5 wt %, at most about 8 wt %, at most about 7.5 wt %, at most about 7 wt %, at most about 6.5 wt %, at most about 6 wt %, at most about 5.5 wt %, or at most about 5 wt %) of the etching composition of this disclosure. Without wishing to be bound by theory, it is believed that the complexing agent can facilitate and enhance the removal of Ta and/or TaN on a semiconductor substrate, while inhibiting the removal of Cu exposed to the etching composition during the etching process.

In general, the etching composition of this disclosure can include at least one (e.g., two, three, or four) solvents. In some embodiments, the etching composition can include a first solvent that is a carboxylic acid. In such embodiments, the first solvent can be a carboxylic acid of the formula: R—COOH, in which R is H or $C_1$-$C_6$ alkyl. Examples of such carboxylic acids include formic acid, acetic acid, trifluoroacetic acid, propionic acid, lactic acid, butyric acid, valeric acid, and caproic acid.

In some embodiments, the first solvent can be the majority component of the etching composition of this disclosure. For example, the first solvent can be from at least about 70 wt % (e.g., at least about 75% by weight, at least about 80% by weight, at least about 85% by weight, at least about 90% by weight, or at least about 95% by weight) to at most about 99.9 wt % (e.g., at most about 99 wt %, at most about 98 wt %, at most about 97 wt %, at most about 96 wt %, at most about 95 wt %, at most about 90 wt %, or at most about 85 wt %) of the etching composition. Without wishing to be bound by theory, it is believed that the carboxylic acids used as the first solvent described herein can facilitate and enhance the removal of Ta and/or TaN on a semiconductor substrate during the etching process.

In some embodiments, the etching composition of this disclosure can include two or more (e.g., two, three, or four) solvents. For example, the etching composition can include at least one second solvent selected from the group consisting of organic solvents (that are not carboxylic acids) and inorganic solvents. Examples of suitable inorganic solvents include water and aqueous solutions. In some embodiments, the water can be de-ionized and ultra-pure, contain no organic contaminants and have a minimum resistivity of about 4 to about 17 mega Ohms, or at least about 17 mega Ohms. In some embodiments, the at least one second solvent (e.g., water) is in an amount of from at least about 0.01 wt % (e.g., at least about 0.05% by weight, at least about 0.1% by weight, at least about 0.5% by weight, at least about 1% by weight, at least about 2% by weight, at least about 3% by weight, at least about 4% by weight, or at least about 5% by weight) to at most about 10 wt % (e.g., at most about 9 wt %, at most about 8 wt %, at most about 7 wt %, at most about 6 wt %, at most about 5 wt %, or at most about 4 wt %) of the etching composition. Without wishing to be bound by theory, it is believed that, if the amount of water is greater than 10 wt % of the composition, it may adversely impact the Ta and/or TaN etch rates, and reduce their removal during the etching process. On the other hand, without wishing to be bound by theory, it is believed that, if the amount of water is less than 0.01 wt %, it would reduce the oxidation capability of the composition, thereby reducing the Ta and/or TaN etch rates.

In some embodiments, the second solvent can be an organic solvent that is not a carboxylic acid. For examples, the organic solvent can be a hydrophobic organic solvent having a partition coefficient (log P) of greater than 0 (e.g., at least about 0.1, at least about 0.2, at least about 0.3, at least about 0.5, at least about 1, at least about 1.5, or at least about 2) and at most about 5. As used herein, the partition coefficient log P is obtained from a biphasic system of n-octanol and water. In some embodiments, the organic solvent can be an alcohol or an ether. The ether can be an alkylene glycol ether (e.g., a dialkylene glycol ether, a trialkylene glycol ether, and a tetraalkylene glycol ether). Examples of such organic solvents include benzyl alcohol, diethylene glycol butyl ether, diethylene glycol dimethyl ether, diethylene glycol diethyl ether, dipropylene glycol diethyl ether, tetraethylene glycol dimethyl ether, and dipropylene glycol dimethyl ether. Without wishing to be bound by theory, it is believed that using a hydrophobic organic solvent can inhibit the removal of the Cu without reducing the removal of Ta or TaN during the etching process.

In some embodiments, the at least one second solvent (e.g., an organic solvent) is in an amount of from at least about 0.1 wt % (e.g., at least about 0.2% by weight, at least about 0.4% by weight, at least about 0.5% by weight, at least about 0.6% by weight, at least about 0.8% by weight, at least about 1% by weight, at least about 1.5% by weight, at least about 2% by weight, at least about 2.5% by weight, or at least about 5% by weight) to at most about 20 wt % (e.g., at most about 15 wt %, at most about 10 wt %, at most about 8 wt %, at most about 6 wt %, at most about 5 wt %, or at most about 4 wt %) of the etching composition of this disclosure.

In some embodiments, the etching composition of this disclosure can further include at least one (e.g., two, three, or four) hexafluorosilicate compound. Examples of suitable hexafluorosilicate compounds include hexafluorosilicic acid ($H_2SiF_6$) and its salts thereof. Specific examples of hexafluorosilicate compounds include $H_2SiF_6$, $Na_2SiF_6$, $K_2SiF_6$, and $(NH_4)_2SiF_6$. In some embodiments, the hexafluorosilicate compound is in an amount of from at least about 0.1 wt % (e.g., at least about 0.2% by weight, at least about 0.4% by weight, at least about 0.5% by weight, at least about 0.6% by weight, at least about 0.8% by weight, at least about 1% by weight, at least about 1.5% by weight, at least about 2% by weight, or at least about 2.5% by weight) to at most about 5 wt % (e.g., at most about 4.5 wt %, at most about 4 wt %, at most about 3.5 wt %, at most about 3 wt %, at most about 2.5 wt %, or at most about 2 wt %) of the etching composition. Without wishing to be bound by theory, it is believed that the hexafluorosilicate compounds described above can facilitate and enhance the removal of Ta and/or TaN on a semiconductor substrate, while inhibiting the removal of a dielectric material ($SiO_2$) exposed to the etching composition during the etching process.

In some embodiments, the etching composition of this disclosure can further include at least one (e.g., two, three, or four) sulfonic acid. Examples of suitable sulfonic acids include p-toluene sulfonic acid, methanesulfonic acid, or dodecylbenzene sulfonic acid. In some embodiments, the sulfonic acid is in an amount of from at least about 0.1 wt % (e.g., at least about 0.2% by weight, at least about 0.4% by weight, at least about 0.5% by weight, at least about 0.6% by weight, at least about 0.8% by weight, at least about 1% by weight, at least about 1.5% by weight, at least about 2% by weight, at least about 2.5% by weight, or at least about 5% by weight) to at most about 10 wt % (e.g., at most about 9 wt %, at most about 8 wt %, at most about 7 wt %, at most about 6 wt %, at most about 5 wt %, at most about 4.5 wt %, at most about 4 wt %, at most about 3.5 wt %, at most about 3 wt %, at most about 2.5 wt %, or at most about 2 wt %) of the etching composition. Without wishing to be bound by theory, it is believed that the sulfonic acids described above can facilitate and enhance the removal of Ta and/or TaN on a semiconductor substrate during the etching process.

In some embodiments, the etching composition of this disclosure can further include at least one (e.g., two, three, or four) surfactant. Examples of suitable surfactants include non-ionic surfactants. In some embodiments, the surfactant is in an amount of from at least about 0.0001 wt % (e.g., at least about 0.001% by weight, at least about 0.01% by weight, at least about 0.1% by weight, at least about 0.2% by weight, at least about 0.3% by weight, at least about 0.4% by weight, or at least about 0.5% by weight) to at most about 1 wt % (e.g., at most about 0.9 wt %, at most about 0.8 wt %, at most about 0.7 wt %, at most about 0.6 wt %, or at most about 0.5 wt %) of the etching composition. Without wishing to be bound by theory, it is believed that the surfactant can facilitate homogeneity of the etching composition and help dissolve components (e.g., a sulfonic acid) in the polycarboxylic acid solvent.

In some embodiments, the etching composition of this disclosure can have a pH of at most about 1 (e.g., at most about 0.9, at most about 0.8, at most about 0.7, at most about 0.6, or at most about 0.5) and/or at least about 0 (e.g., at least about 0.1, at least about 0.2, at least about 0.3, at least about 0.4, or at least about 0.5). Without wishing to be bound by theory, it is believed that an etching composition having a pH higher than 1 would not have sufficient Ta and/or TaN etch rates as a sufficiently high acidity is needed to remove these materials, and an etching composition having a pH lower than 0 could decompose certain components in the composition due to strong acidity.

In addition, in some embodiments, the etching composition of the present disclosure may contain additives such as, pH adjusting agents, corrosion inhibitors, additional surfactants, additional organic solvents, biocides, and defoaming agents as optional components. Examples of suitable defoaming agents include polysiloxane defoamers (e.g., polydimethylsiloxane), polyethylene glycol methyl ether polymers, ethylene oxide/propylene oxide copolymers, and glycidyl ether capped acetylenic diol ethoxylates (such as those described in U.S. Pat. No. 6,717,019, herein incorporated by reference). Examples of suitable surfactants may be cationic, anionic, nonionic or amphoteric.

In general, the etching composition of the present disclosure can have a relatively high Ta/Cu and/or TaN/Cu etch selectivity (i.e., a high ratio of Ta etch rate over Cu etch rate and/or a high ratio of TaN etch rate over Cu etch rate). In some embodiments, the etching composition can have a Ta/Cu and/or TaN/Cu etch selectivity of at least about 2 (e.g., at least about 3, at least about 4, at least about 5, at least about 6, at least about 7, at least about 8, at least about 9, at least about 10, at least about 15, at least about 20, at least about 30, at least about 40, or at least about 50) and/or at most about 500 (e.g., at most about 100).

In general, the etching composition of the present disclosure can have a relatively high Ta/dielectric material (e.g., $SiO_2$ or low-k materials) and/or TaN/dielectric material etch selectivity (i.e., a high ratio of Ta etch rate over dielectric material etch rate and/or a high ratio of TaN etch rate over dielectric material etch rate). In some embodiments, the etching composition can have a Ta/dielectric material and/or TaN/dielectric material etch selectivity of at least about 2 (e.g., at least about 3, at least about 4, at least about 5, at least about 6, at least about 7, at least about 8, at least about 9, at least about 10, at least about 15, at least about 20, at least about 30, at least about 40, or at least about 50) and/or at most about 500 (e.g., at most about 100).

In some embodiments, the etching compositions of the present disclosure may specifically exclude one or more of the additive components, in any combination, if more than one. Such components are selected from the group consisting of oxidizing agents (such as those described herein), polymers, oxygen scavengers, quaternary ammonium salts (including quaternary ammonium hydroxides), amines, alkaline bases (such as NaOH, KOH, and LiOH), surfactants other than a defoamer, a defoamer, fluoride containing compounds, abrasives, silicates, hydroxycarboxylic acids containing more than two hydroxyl groups, carboxylic and polycarboxylic acids lacking amino groups, silanes (e.g., alkoxysilanes), cyclic compounds (e.g., azoles (such as diazoles, triazoles, or tetrazoles), triazines, and cyclic compounds containing at least two rings, such as substituted or unsubstituted naphthalenes, or substituted or unsubstituted biphenylethers), buffering agents, non-azole corrosion inhibitors, and metal halides.

The etching composition of this disclosure can be prepared by simply mixing the components together, or may be prepared by blending two compositions in a kit. The first composition in the kit can be an aqueous solution of an oxidizing agent (e.g., nitric acid). The second composition in the kit can contain the remaining components of the etching composition of this disclosure at predetermined ratios in a concentrated form such that the blending of the two compositions will yield a desired etching composition of the disclosure.

In some embodiments, the present disclosure features a method of etching a semiconductor substrate containing Ta and/or TaN (e.g., features containing Ta and/or TaN). The method includes contacting a semiconductor substrate containing Ta and/or TaN with an etching composition of this disclosure to remove Ta and/or TaN. The method can further include rinsing the semiconductor substrate with a rinse solvent after the contacting step and/or drying the semiconductor substrate after the rinsing step. In some embodiments, the method does not substantially remove Cu or a dielectric material (e.g., $SiO_2$) in the semiconductor substrate. For example, the method does not remove more than about 5% by weight (e.g., more than about 3% by weight or more than about 1% by weight) of Cu or a dielectric material in the semiconductor substrate.

In some embodiments, the etching method includes the steps of:

(A) providing a semiconductor substrate containing Ta and/or TaN;

(B) contacting the semiconductor substrate with an etching composition described herein;

(C) rinsing the semiconductor substrate with one or more suitable rinse solvents; and (D) optionally, drying the semiconductor substrate (e.g., by any suitable means that removes the rinse solvent and does not compromise the integrity of the semiconductor substrate).

The semiconductor substrates containing Ta and/or TaN to be etched in this method can contain organic and organometallic residues, and additionally, a range of metal oxides that may also be removed during the etching process.

Semiconductor substrates (e.g., wafers) typically are constructed of silicon, silicon germanium, Group III-V compounds such as GaAs, or any combination thereof. The semiconductor substrates can additionally contain exposed integrated circuit structures such as interconnect features (e.g., metal lines and dielectric materials). Metals and metal alloys used for interconnect features include, but are not limited to, aluminum, aluminum alloyed with copper, copper, titanium, tantalum, cobalt, silicon, titanium nitride, tantalum nitride, and tungsten. The semiconductor substrates may also contain layers of interlayer dielectrics, silicon oxide, silicon nitride, silicon carbide, titanium oxide, and carbon doped silicon oxides.

A semiconductor substrate can be contacted with the etching composition by any suitable method, such as placing the etching composition into a tank and immersing and/or submerging the semiconductor substrate into the etching composition, spraying the etching composition onto the semiconductor substrate, streaming the etching composition onto the semiconductor substrate, or any combinations thereof.

The etching composition of the present disclosure can be effectively used up to a temperature of about 85° C. (e.g., from about 20° C. to about 80° C., from about 55° C. to about 65° C., or from about 60° C. to about 65° C.). The etch rates of Ta and/or TaN increase with temperature in this range, thus the processes with higher temperature can be run for shorter times. Conversely, lower etching temperatures typically require longer etching times.

Etching times can vary over a wide range depending on the particular etching method, thickness, and temperature employed. When etching in an immersion batch type process, a suitable time range is, for example, up to about 10 minutes (e.g., from about 1 minute to about 7 minutes, from about 1 minute to about 5 minutes, or from about 2 minutes to about 4 minutes). Etching times for a single wafer process can range from about 30 seconds to about 5 minutes (e.g., from about 30 seconds to about 4 minutes, from about 1 minute to about 3 minutes, or from about 1 minute to about 2 minutes).

To further promote the etching ability of the etching composition of the present disclosure, mechanical agitation means can be employed. Examples of suitable agitation means include circulation of the etching composition over the substrate, streaming or spraying the etching composition over the substrate, and ultrasonic or megasonic agitation during the etching process. The orientation of the semiconductor substrate relative to the ground can be at any angle. Horizontal or vertical orientations are preferred.

Subsequent to the etching, the semiconductor substrate can be rinsed with a suitable rinse solvent for about 5 seconds up to about 5 minutes with or without agitation means. Multiple rinse steps employing different rinse solvents can be employed. Examples of suitable rinse solvents include, but are not limited to, deionized (DI) water, methanol, ethanol, isopropyl alcohol, N-methylpyrrolidinone, gamma-butyrolactone, dimethyl sulfoxide, ethyl lactate and propylene glycol monomethyl ether acetate. Alternatively, or in addition, aqueous rinses with pH>8 (such as dilute aqueous ammonium hydroxide) can be employed. Examples of rinse solvents include, but are not limited to, dilute aqueous ammonium hydroxide, DI water, methanol, ethanol, and isopropyl alcohol. The rinse solvent can be applied using means similar to that used in applying an etching composition described herein. The etching composition may have been removed from the semiconductor substrate prior to the start of the rinsing step or it may still be in contact with the semiconductor substrate at the start of the rinsing step. In some embodiments, the temperature employed in the rinsing step is between 16° C. and 27° C.

Optionally, the semiconductor substrate is dried after the rinsing step. Any suitable drying means known in the art can be employed. Examples of suitable drying means include spin drying, flowing a dry gas across the semiconductor substrate, or heating the semiconductor substrate with a heating means such as a hotplate or infrared lamp, Maragoni drying, rotagoni drying, IPA drying or any combinations thereof. Drying times will be dependent on the specific method employed but are typically on the order of 30 seconds up to several minutes.

In some embodiments, the etching method described herein further includes forming a semiconductor device (e.g., an integrated circuit device such as a semiconductor chip) from the semiconductor substrate obtained by the method described above.

The present disclosure is illustrated in more detail with reference to the following examples, which are for illustrative purposes and should not be construed as limiting the scope of the present disclosure.

EXAMPLES

Any percentages listed are by weight (wt %) unless otherwise specified. Controlled stirring during testing was done with a 1 inch stirring bar at 300 rpm unless otherwise noted.

General Procedure 1

Formulation Blending

Samples of etching compositions were prepared by adding, while stirring, to the calculated amount of the solvent the remaining components of the formulation. After a uniform solution was achieved, optional additives, if used, were added.

General Procedure 2

Materials and Methods

Blanket film etch rate measurements on films were carried out using commercially available unpatterned 300 mm diameter wafers that were diced into 0.5"×0.5" test coupons for evaluation. Primary blanket film materials used for testing include 1) a low-k film (with a k value of 2.55) of about 1000 Å thickness deposited on a silicon substrate; 2) an unalloyed copper metal film of about 1000 Å thickness deposited on a silicon substrate, 3) a tantalum film of about 250 Å thickness deposited on 1000 Å $SiO_2$ on a silicon substrate; 4) a tantalum nitride film of about 250 Å thickness deposited on 1000 Å $SiO_2$ on a silicon substrate, and 5) a blanket CVD $SiO_2$ and/or a thermal oxide ($SiO_2$) film of about 1000 Å thickness deposited on a silicon substrate.

The blanket film test coupons were measured for pre-treatment and post-treatment thickness to determine blanket film etch rates. For the copper and tantalum metal blanket films, the film thickness was measured by sheet resistance using a Keithley Model 8009 Resistivity test fixture 4-point probe. For the TaN, $SiO_2$ and low-k films, the film thicknesses were measured pre-treatment and post-treatment by Ellipsometry using a Woollam VASE.

Patterned test coupons were evaluated for etching and materials compatibility in the test solutions prepared by General Procedure 1 according to the procedures described in General Procedure 3.

Patterned test coupons Cu/Ta (3 nm)/TaN (3 nm)/ILD were evaluated for materials compatibility and/or etching responses. The post-treatment test coupons were then subjected to evaluation by scanning electron microscopy (SEM). The SEM images from the post treatment coupon were compared to a previously taken pre-treatment SEM image set to evaluate materials compatibility and etching response of each test formulation with the patterned test device features.

General Procedure 3

Etching Evaluation with Beaker Test

All blanket film etch testing was carried out at room temperature (21-23° C.) in a 600 mL glass beaker containing 200 g of a sample solution with continuous stirring at 250 rpm, with the Parafilm® cover in place at all times to minimize evaporative losses. All blanket test coupons having a blanket metal or dielectric film exposed on one side to the sample solution were diced by diamond scribe into 0.5"×0.5" square test coupon size for beaker scale testing. Each individual test coupon was held into position using a single 4" long, locking plastic tweezers clip. The test coupon, held on one edge by the locking tweezers clip, suspended into the 600 mL glass beaker and immersed into the 200 g test solution while the solution was stirred continuously at 250 rpm at room temperature. Immediately after each sample coupon was placed into the stirred solution, the top of the 600 mL glass beaker was covered and resealed with Parafilm®. The test coupons were held static in the stirred solution until the treatment time (as described in General Procedures 3A) had elapsed. After the treatment time in the test solution had elapsed, the sample coupons were immediately removed from the 600 mL glass beaker and rinsed according to General Procedure 3A. After the final DI rinse step, all test coupons were subject to a filtered nitrogen gas blow off step using a hand held nitrogen gas blower which forcefully removed all traces of DI water to produce a final dry sample for test measurements.

General Procedure 3A (Blanket Test Coupons)

Immediately after a treatment time of 10 minutes according to General Procedure 3, the coupon was immersed in a 1000 mL volume of ultra-high purity deionized (DI) water with ~1 liter/min overflow rate at 20° C. for 30 seconds and then for an additional 30 seconds with mild agitation. The processing was completed according to General Procedure 3.

General Procedure 3B (Patterned Test Coupons)

Immediately after a treatment time of 2.5-3 minutes (depending on the experiment) the patterned test coupon was immersed in isopropyl alcohol (IPA) or ultra-high purity deionized water at 20° C. for 20 seconds with mild agitation to affect an post-treatment rinse. The patterned test coupons were removed from the IPA or DI water and immediately placed into a 1 wt % citric acid solution for 30 seconds with mild agitation, followed by a final 30 second rinse in the 1000 mL DI water overflow rinse. The processing was completed according to General Procedure 3.

Example 1

Formulation Examples 1-4 (FE-1 to FE-4) were prepared according to General Procedure 1, and evaluated according to General Procedures 2 and 3a. The formulations and the test results are summarized in Table 1.

TABLE 1

| Composition [wt %] | FE-1 | FE-2 | FE-3 | FE-4 |
| --- | --- | --- | --- | --- |
| Hydrofluoric acid | 1.50% | 1.50% | 1.50% | 1.50% |
| Nitric acid | 0.10% | 0.10% | 0.10% | 0.10% |
| Acetic acid | 96.11% | 96.01% | 96.01% | 96.01% |
| Citric acid | | 0.10% | | |
| Oxalic acid | | | 0.10% | |
| Benzoguanamine | | | | 0.10% |
| Water | 2.29% | 2.29% | 2.29% | 2.29% |
| Total | 100.00% | 100.00% | 100.00% | 100.00% |
| Test results | | | | |
| Observation @RT | Clear | Clear | Clear | Clear |
| TaN ER (Å/min., RT/3 min.) | 29.4 | 48.2 | 30.9 | 0.0 |
| Cu ER (Å/min., RT/30 min.) | 24.6 | 61.8 | 1.0 | −0.1 |
| Low-k ER (Å/min., RT/10 min.) | −0.5 | −0.6 | −0.4 | −0.2 |

As shown in Table 1, FE-1 (which contained no complexing agent) and FE-2 (which contained citric acid as a complexing agent) exhibited relatively high Cu etch rates and relatively low TaN/Cu etch selectivity (i.e., ratio between TaN and Cu etch rates). In addition, FE-4 (which contained benzoguanamine as a complexing agent) exhibited no TaN etch rate. By contrast, FE-3 (which contained oxalic acid (a polycarboxylic acid) as a complexing agent) surprisingly exhibited high TaN etch rate and low Cu etch rate, resulting in high TaN/Cu etching selectivity. In other words, FE-3 could effectively remove TaN while minimizing the removal of exposed Cu on a semiconductor substrate during the etching process.

Example 2

Formulation Examples 5-11 (FE-5 to FE-11) were prepared according to General Procedure 1, and evaluated according to General Procedures 2 and 3a. The formulations and the test results are summarized in Table 2.

TABLE 2

| Composition [wt %] | FE-5 | FE-6 | FE-7 | FE-8 | FE-9 | FE-10 | FE-11 |
|---|---|---|---|---|---|---|---|
| HF | 0.40% | 0.40% | 0.40% | 0.40% | 0.40% | 0.40% | 0.40% |
| $HNO_3$ | 0.10% | 0.10% | 0.10% | 0.10% | 0.10% | 0.10% | 0.10% |
| Acetic acid | 93.64% | 93.34% | 89.84% | 89.84% | 89.84% | 89.84% | 89.84% |
| Water | 3.28% | 3.28% | 3.28% | 3.28% | 3.28% | 3.28% | 3.28% |
| Oxalic acid | 0.20% | 0.50% | 4.00% | | | | |
| $H_2SiF_6$ | 1.36% | 1.36% | 1.36% | 1.36% | 1.36% | 1.36% | 1.36% |
| p-Toluene solfonic acid monohydrate | 1.00% | 1.00% | 1.00% | 1.00% | 1.00% | 1.00% | 1.00% |
| Citric acid | | | | 4.00% | | | |
| Glycerol | | | | | 4.00% | | |
| Tartaric acid diammonium salt | | | | | | 4.00% | |
| 2-Hydroxybenzoic acid | | | | | | | 4.00% |
| Plurafac LF231 (Nonionic surfactant) | 0.020% | 0.020% | 0.020% | 0.020% | 0.020% | 0.020% | 0.020% |
| Total (wt %) | 100.00% | 100.00% | 100.00% | 100.00% | 100.00% | 100.00% | 100.00% |
| Test Results | | | | | | | |
| Observation @RT | Clear | Clear | Clear | Clear | Clear | Precipitation | Clear |
| TaN ER (A/min., RT/5 min.) | 149.7 | 193.9 | >400 | >400 | −0.4 | 4.1 | >400 |
| Ta ER (A/min., RT/5 min.) | 66.3 | 83.4 | 118.3 | 119.8 | −2.0 | −2.3 | 136.1 |
| Cu ER (A/min., RT/30 min.) | 1.3 | 0.9 | 5.7 | 11.9 | 1.0 | 24.3 | 31.2 |

As shown in Table 2, FE-9 (which contained glycerol as a complexing agent) and FE-10 (which contained tartaric acid diammonium salt as a complexing agent) exhibited low Ta and TaN etch rates, and low Ta/Cu and TaN/Cu etch selectivity. By contrast, FE-5 to FE-7 (which contained oxalic acid as a complexing agent), FE-8 (which contained citric acid as a complexing agent), and FE-11 (which contained 2-hydroxybenzoic acid as a complexing agent) surprisingly exhibited high Ta and TaN etch rates and low Cu etch rates, resulting in high Ta/Cu and TaN/Cu etch selectivity. In other words, these three formulations could effectively remove Ta and TaN while minimizing the removal of exposed Cu on a semiconductor substrate during the etching process.

Example 3

Formulation Examples 12-16 (FE-12 to FE-16) were prepared according to General Procedure 1, and evaluated according to General Procedures 2 and 3a. The formulations and the test results are summarized in Table 3.

TABLE 3

| Composition [wt %] | FE-12 | FE-13 | FE-14 | FE-15 | FE-16 |
|---|---|---|---|---|---|
| Hydrofluoric acid | 0.12% | 0.12% | 0.12% | 0.12% | 0.40% |
| Nitric acid | 0.12% | 0.12% | 0.12% | 0.12% | 0.12% |
| Acetic acid | 89.53% | 89.63% | 90.53% | 85.53% | 88.93% |
| $H_2O$ | 2.87% | 2.87% | 2.87% | 2.87% | 3.29% |

TABLE 3-continued

| Composition [wt %] | FE-12 | FE-13 | FE-14 | FE-15 | FE-16 |
|---|---|---|---|---|---|
| Oxalic acid | 4.00% | 4.00% | 4.00% | 4.00% | 4.00% |
| $H_2SiF_6$ | 1.36% | 1.36% | 1.36% | 1.36% | 1.36% |
| p-Toluene solfonic acid monohydrate | 1.00% | 1.00% | | 5.00% | 1.00% |
| Dipropylene glycol dimethyl ether | 1.00% | | 1.00% | 1.00% | |
| Benzyl alcohol | | 0.90% | | | 0.90% |
| Total (wt %) | 100.00% | 100.00% | 100.00% | 100.00% | 100.00% |
| | | Test Results | | | |
| Appearance @RT | Clear | Clear | Clear | Clear | Clear |
| Appearance after beaker test | Clear | Clear | Clear | Clear | Clear |
| $CVD-SiO_2$ ER (A/min., RT/3 min.) | 32.3 | 36.0 | 34.4 | 33.4 | 77.2 |
| TaN ER (A/min., RT/4 min.) | 1.3 | 8.5 | 0.8 | 3.2 | 67.5 |
| Ta ER (A/min., RT/4 min.) | 0.2 | 4.9 | 0.7 | 0.5 | 1.9 |
| Cu ER (A/min., RT/10 min.) | 0.0 | 0.6 | 0.2 | −0.2 | 0.4 |

As shown in Table 3, FE-12 to FE-16 (which contained a hydrophobic solvent (i.e., dipropylene glycol dimethyl ether or benzyl alcohol) having a log P greater than 0) exhibited low etch rates for Cu, and acceptable Ta/Cu and/or TaN/Cu etch selectivity. In other words, these data suggest that hydrophobic solvents can inhibit Cu corrosion during the etching process.

Example 4

Formulation Examples 17-19 (FE-17 to FE-19) were prepared according to General Procedure 1, and evaluated according to General Procedures 2 and 3a. The formulations and the test results are summarized in Table 4.

TABLE 4

| Composition [wt %] | FE-17 | FE-18 | FE-19 |
|---|---|---|---|
| Hydrofluoric acid | 1.50% | 1.50% | 1.50% |
| Nitric acid | 0.10% | 0.10% | 0.10% |
| Acetic acid | 95.51% | 94.61% | 95.61% |
| Oxalic acid | 0.50% | 0.50% | 0.50% |
| $H_2O$ | 2.29% | 2.29% | 2.29% |

TABLE 4-continued

| Composition [wt %] | FE-17 | FE-18 | FE-19 |
|---|---|---|---|
| Dodecylbenzene sulfonic acid | 0.10% | | |
| p-Toluene sulfonic acid monohydrate | | 1.00% | |
| Total (wt %) | 100.00% | 100.00% | 100.00% |
| | Test Results | | |
| Observation @RT | Clear | Clear | Clear |
| TaN ER (A/min., RT/3 min.) | 34.3 | 118.1 | 30.5 |
| thermal $SiO_2$ ER (A/min., RT/10 min.) | 14.5 | 16.1 | 13.9 |

As shown in Table 4, FE-17 to FE-18 (which contained a sulfonic acid) exhibited relatively high TaN etch rates compared to FE-19 (which did not contain a sulfonic acid).

Example 5

Formulation Examples 20-24 (FE-20 to FE-24) were prepared according to General Procedure 1, and evaluated according to General Procedures 2 and 3a. The formulations and the test results are summarized in Table 5.

TABLE 5

| Composition [wt %] | FE-20 | FE-21 | FE-22 | FE-23 | FE-24 |
|---|---|---|---|---|---|
| Hydrofluoric acid | 0.40% | 0.40% | 0.40% | 0.40% | 0.40% |
| Nitric acid | 0.10% | 0.07% | 0.10% | 0.10% | 0.10% |
| Acetic acid | 92.86% | 92.90% | 96.36% | 97.34% | 96.33% |
| Oxalic acid | 2.00% | 2.00% | 0.50% | 0.50% | 0.50% |
| $H_2O$ | 0.64% | 0.63% | 0.64% | 0.64% | 0.64% |
| Methansulfonic acid | | | | 1.01% | 2.02% |
| p-Toluene sulfonic acid monohydrate | 4.00% | 4.00% | 2.00% | | |
| Total (wt %) | 100.00% | 100.00% | 100.00% | 100.00% | 100.00% |
| | | Test Results | | | |
| Observation @RT | Clear | Clear | Clear | Clear | Clear |
| TaN ER (A/min., RT/3 min.) | 59.1 | 56.0 | 60.0 | 29.8 | 38.0 |
| Cu ER (A/min., RT/30 min.) w/pretreatment | 5.8 | 4.8 | 11.8 | 5.7 | 8.2 |

TABLE 5-continued

| Composition [wt %] | FE-20 | FE-21 | FE-22 | FE-23 | FE-24 |
|---|---|---|---|---|---|
| low-k ER (A/min., RT/10 min.) | 0.0 | 0.0 | 0.0 | 0.0 | 0.0 |
| thermal SiO₂ ER (A/min., RT/10 min.) | 4.7 | 4.8 | 4.6 | 4.6 | 4.8 |

As shown in Table 5, FE-20 to FE-24 (which contained a sulfonic acid) exhibited relatively high TaN etch rates, relatively low Cu etch rates, and relatively high TaN/Cu etch selectivity.

Example 6

Formulation Examples 25-27 (FE-25 to FE-27) were prepared according to General Procedure 1, and evaluated according to General Procedures 2 and 3a. The formulations and the test results are summarized in Table 6.

TABLE 6

| Composition [wt %] | FE-25 | FE-26 | FE-27 |
|---|---|---|---|
| Hydrofluoric acid | 0.12% | 0.12% | 0.12% |
| Nitric acid | 0.12% | 0.12% | 0.12% |
| Acetic acid | 90.03% | 89.83% | 89.63% |
| H₂O | 2.87% | 2.87% | 2.87% |
| Oxalic acid | 4.00% | 4.00% | 4.00% |
| H₂SiF₆ | 1.36% | 1.36% | 1.36% |
| p-Toluene solfonic acid monohydrate | 1.00% | 1.00% | 1.00% |
| Benzyl alcohol, log P 1.03 | 0.50% | 0.70% | 0.90% |
| Total (wt %) | 100.00% | 100.00% | 100.00% |
| Test Results | | | |
| Apperance @RT | Clear | Clear | Clear |
| Apperance after beaker test | Clear | Clear | Clear |
| Ta ER (A/min., RT/4 min.) | 10.3 | 6.8 | 4.9 |
| TaN ER (A/min., RT/4 min.) | 15.0 | 13.3 | 8.5 |
| EP-Cu ER (A/min., RT/10 min.) | 8.5 | 5.7 | 0.6 |

As shown in Table 6, increasing the amount of benzyl alcohol in FE-25 to FE-27 reduced their Cu etch rates.

Example 7

Formulation Examples 28-34 (FE-28 to FE-34) were prepared according to General Procedure 1, and evaluated according to General Procedures 2 and 3a. The formulations and the test results are summarized in Table 7.

TABLE 7

| Composition [wt %] | FE-28 | FE-29 | FE-30 | FE-31 | FE-32 | FE-33 | FE-34 |
|---|---|---|---|---|---|---|---|
| Hydrofluoric acid | 1.50% | 1.50% | 1.50% | 1.50% | 1.50% | 1.50% | 1.50% |
| Nitric acid | 0.10% | 0.10% | 0.10% | 0.10% | 0.18% | 0.10% | 0.10% |
| Acetic acid | 85.61% | 85.61% | 85.61% | 85.61% | 85.49% | 85.61% | 94.77% |
| Oxalic acid | 0.50% | 0.50% | 0.50% | 0.50% | 0.50% | 0.50% | 0.50% |
| H₂O | 2.29% | 2.29% | 2.29% | 2.29% | 2.33% | 2.29% | 2.29% |
| Ethanol, logP −0.19 | 10.00% | | | | | | |
| Glycerol, logP −2.32 | | 10.00% | | | | | |
| 1,2-Propanediol, logP −1.34 | | | 10.00% | | | | |
| Diethylene glycol butyl ether, logP 0.34 | | | | 10.00% | | | |
| 1,4-Butanediol, logP −1.02 | | | | | 10.00% | | |
| Dipropylene glycol dimethyl ether, logP 0.37 | | | | | | 10.00% | |
| Total (wt %) | 100.00% | 100.00% | 100.00% | 100.00% | 100.00% | 100.00% | 99.16% |
| Test Results | | | | | | | |
| Observation @RT | Clear | Clear | Clear | Clear | Clear | Clear | Clear |
| TaN ER (A/min., RT/3 min.) | 6.6 | −0.5 | 1.8 | 15 | 13.9 | 17.1 | 30.5 |
| Cu ER (A/min., RT/30 min.) w/ pretreatment | 0 | −0.3 | −0.3 | 0.9 | 1.7 | 2.2 | 5.3 |
| low-k ER (A/min., RT/10 min.) | −0.2 | −0.1 | −0.1 | −0.3 | −0.1 | −0.1 | −0.1 |
| thermal SiO₂ ER (A/min., RT/10 min.) | 8.7 | 7.9 | 8.2 | 9.5 | 10.1 | 8.7 | 13.9 |

As shown in Table 7, although FE-28 to FE-30 and FE-32 (each of which contained a solvent with a log P value less than 0) exhibited relatively low Cu etch rates, they also exhibited relatively low TaN etch rates. On the other hand, FE-31 and FE-33 (each of which contained a solvent with a log P value greater than 0) exhibited relatively low Cu etch rates but relatively high TaN etch rates, thereby resulting in relatively high TaN/Cu etch selectivity.

Further, the results show that FE-28 to FE33 (each of which contained an alcohol solvent) exhibited lower TaN etch rates than FE-34 (which did not contain an alcohol solvent). Without wishing to be bound by theory, it is believed that the presence of an alcohol may reduce the TaN etch rate of an etching composition.

Example 8

Formulation Examples 35-39 (FE-35 to FE-39) were prepared according to General Procedure 1, and evaluated according to General Procedures 2 and 3a. The formulations and the test results are summarized in Table 8.

TABLE 8

| Composition [wt %] | FE-35 | FE-36 | FE-37 | FE-38 | FE-39 |
|---|---|---|---|---|---|
| Hydrofluoric acid | 1.50% | 1.50% | 1.50% | 1.50% | 1.50% |
| Nitric acid | 0.10% | 0.10% | 0.10% | 0.10% | 0.10% |
| Acetic acid | 85.61% | 85.61% | 85.61% | 94.11% | 88.11% |
| Oxalic acid | 0.50% | 0.50% | 0.50% | 2.00% | 8.00% |
| $H_2O$ | 2.29% | 2.29% | 2.29% | 2.29% | 2.29% |
| Sulfolane, logP −0.77 | 10.00% | | | | |
| Benzyl alcohol, logP 1.03 | | 10.00% | | | |
| DMSO, logP −1.19 | | | 10.00% | | |
| Total (wt %) | 100.00% | 100.00% | 100.00% | 100.00% | 100.00% |
| Test Results | | | | | |
| Observation @RT | Clear | Clear | Clear | Clear | Clear |
| TaN ER (A/min., RT/3 min.) | 33.8 | 20.6 | 0.9 | 28.1 | >150 |
| Cu ER (A/min., RT/30 min.) w/pretreatment | 8.0 | 0.9 | 0.9 | 1.8 | 0.7 |
| low-k ER (A/min., RT/10 min.) | −0.8 | −0.1 | −0.2 | −0.2 | −0.7 |
| thermal $SiO_2$ ER (A/min., RT/10 min.) | 11.2 | 13.3 | 8.6 | 14.7 | 17.7 |

As shown in Table 8, FE-35 and FE-37 (each of which contained a solvent with a log P value less than 0) exhibited relatively low TaN/Cu etch selectivity. On the other hand, FE-36 (which contained a solvent with a log P value greater than 0) exhibited relatively low Cu etch rates but relatively high TaN etch rates, thereby resulting in relatively high TaN/Cu etch selectivity. In addition, FE-38 and FE-39 (each of which contained no organic solvent other than acetic acid) also exhibited relatively high TaN/Cu etching selectivity.

Example 9

Formulation Examples 40-43 (FE-40 to FE-43) were prepared according to General Procedure 1, and evaluated according to General Procedures 2 and 3a. The formulations and the test results are summarized in Table 9.

TABLE 9

| Composition [wt %] | FE-40 | FE-41 | FE-42 | FE-43 |
|---|---|---|---|---|
| Hydrofluoric acid | 1.50% | 1.50% | 0.80% | 0.80% |
| Nitric acid | 0.12% | 0.10% | 0.10% | 0.10% |
| Acetic acid | 95.58% | 95.61% | 93.36% | 89.36% |
| $H_2O$ | 2.30% | 2.29% | 3.88% | 6.52% |
| Oxalic acid | 0.50% | 0.50% | 0.50% | 0.50% |
| $H_2SiF_6$ | | | 1.36% | 2.72% |
| Total (wt %) | 100.00% | 100.00% | 100.00% | 100.00% |
| Test Results | | | | |
| Observation @RT | Clear | Clear | Clear | Clear |
| TaN ER (A/min., RT/5 min.) | 31.4 | 22.5 | >400 | >400 |
| Ta ER (A/min., RT/5 min.) | >400 | >400 | >400 | >400 |
| Cu ER (A/min., RT/30 min.) | 1.2 | 0.7 | 5.1 | 7.2 |
| CVD-$SiO_2$ ER (A/min., RT/2 min.) | 107.1 | 107.4 | 108.1 | 139.8 |

As shown in Table 9, all of FE-40 to FE-43 exhibited high Ta/Cu and TaN/Cu etching selectivity. However, all four formulations exhibited relatively high etch rates for $SiO_2$ (a dielectric material). On the other hand, including $H_2SiF_6$ in FE-42 and FE-43 significantly improved their TaN etch rate without significantly increasing their $SiO_2$ etch rates, thereby resulting in improved TaN/$SiO_2$ etch selectivity.

Example 10

Formulation Examples 44-45 (FE-44 to FE-45) were prepared according to General Procedure 1, and evaluated according to General Procedures 2 and 3a. The formulations and the test results are summarized in Table 10.

TABLE 10

| Composition [wt %] | FE-44 | FE-45 |
|---|---|---|
| Hydrofluoric acid | 0.40% | 0.40% |
| Nitric acid | 0.045% | 0% |
| Acetic acid | 90.93% | 90.98% |

TABLE 10-continued

| Composition [wt %] | FE-44 | FE-45 |
|---|---|---|
| $H_2O$ | 3.26% | 3.26% |
| Oxalic acid | 4.00% | 4.00% |
| $H_2SiF_6$ | 1.36% | 1.36% |
| Total (wt %) | 100.00% | 100.00% |
| Test Results | | |
| TaN ER (Å/min., RT/5 min.) | 20.1 | 5.1 |
| Ta ER (Å/min., RT/5 min.) | 3.5 | 0.1 |
| Cu ER (Å/min., RT/30 min.) | 0.8 | 0.2 |

As shown in Table 10, FE-45 exhibited relatively high Ta/Cu and TaN/Cu etching selectivity. In addition, although FE-45 did not include any oxidizing agent (i.e., nitric acid), it still exhibited relatively high TaN/Cu etching selectivity.

Example 11

Formulation Examples 46-49 (FE-46 to FE-49) were prepared according to General Procedure 1, and evaluated according to General Procedures 2 and 3b. The formulations and the test results are summarized in Table 11.

TABLE 11

| Composition [wt %] | FE-46 | FE-47 | FE-48 | FE-49 |
|---|---|---|---|---|
| Hydrofluoric acid | 1.00% | 1.00% | 1.00% | 1.00% |
| Acetic acid | 94.00% | 93.00% | 91.00% | 91.20% |
| $H_2O$ | 1.00% | 2.00% | 4.00% | 3.04% |
| Oxalic acid | 4.00% | 4.00% | 4.00% | 4.00% |
| $H_2SiF_6$ | | | | 1.36% |
| Total (wt %) | 100.00% | 100.00% | 100.00% | 100.00% |
| Test Results | | | | |
| TaN removal | Removed in 150 s | Removed in 150 s | Removed in 150 s | Removed in 150 s |
| Cu ER (Å/min., RT/30 min.) | 0.1 | −1.7 | −1.5 | 0.8 |

As shown in Table 11, although FE-46 to FE-49 did not include any oxidizing agent (i.e., nitric acid), they still exhibited relatively high TaN/Cu etching selectivity and were able to remove the TaN layer in a patterned wafer.

While the invention has been described in detail with reference to certain embodiments thereof, it will be understood that modifications and variations are within the spirit and scope of that which is described and claimed.

What is claimed is:

1. An etching composition, comprising:
    a) hydrofluoric acid in an amount of from about 0.1 wt % to about 5 wt % of the composition;
    b) at least one carboxylic acid, wherein the at least one carboxylic acid is in an amount of from about 85 wt % to about 99.9 wt % of the composition;
    c) at least one complexing agent selected from the group consisting of polycarboxylic acids and hydroxycarboxylic acids, wherein the at least one complexing agent is in an amount of from about 0.1 wt % to about 10 wt % of the composition; and
    d) water in an amount of from about 0.01 wt % to about 10 wt % of the composition.

2. The composition of claim 1, wherein the hydrofluoric acid is in an amount of from about 0.1 wt % to about 4.5 wt % of the composition.

3. The composition of claim 1, wherein at least one carboxylic acid comprises R—COOH, in which R is H or $C_1$-$C_6$ alkyl.

4. The composition of claim 1, wherein the at least one carboxylic acid comprises formic acid, acetic acid, trifluoroacetic acid, propionic acid, lactic acid, butyric acid, valeric acid, or caproic acid.

5. The composition of claim 1, wherein the at least one carboxylic acid is in an amount of from about 85 wt % to about 99 wt % of the composition.

6. The composition of claim 1, wherein the at least one complexing agent comprises oxalic acid, citric acid, or 2-hydroxybenzoic acid.

7. The composition of claim 1, wherein the at least one complexing agent is in an amount of from about 0.1 wt % to about 9.5 wt % of the composition.

8. The composition of claim 1, further comprising at least one oxidizing agent.

9. The composition of claim 8, wherein the at least one oxidizing agent comprises nitric acid, $KMnO_4$, $H_2O_2$, $H_5IO_5$, or $NaClO_4$.

10. The composition of claim 1, wherein the at least one oxidizing agent is in an amount of from about 0.01 wt % to about 0.5 wt % of the composition.

11. The composition of claim 1, further comprising at least one hexafluorosilicate compound.

12. The composition of claim 11, wherein the at least one hexafluorosilicate compound comprises $H_2SiF_6$, $Na_2SiF_6$, $K_2SiF_6$, or $(NH_4)_2SiF_6$.

13. The composition of claim 11, wherein the at least one hexafluorosilicate compound is in an amount of from about 0.1 wt % to about 5 wt % of the composition.

14. The composition of claim 1, further comprising at least one sulfonic acid.

15. The composition of claim 14, wherein the at least one sulfonic acid comprises p-toluene sulfonic acid, methanesulfonic acid, or dodecylbenzene sulfonic acid.

16. The composition of claim 14, wherein the at least one sulfonic acid is in an amount of from about 0.1 wt % to about 10 wt % of the composition.

17. The composition of claim 1, wherein the water is in an amount of from about 0.01 wt % to about 9 wt % of the composition.

18. The composition of claim 1, further comprising at least one organic solvent.

19. The composition of claim 18, wherein the at least one organic solvent has a partition coefficient (log P) of greater than 0.

20. The composition of claim 18, wherein the organic solvent is in an amount of from about 0.1 wt % to about 20 wt % of the composition.

21. The composition of claim 1, further comprising at least one surfactant.

22. The composition of claim 21, wherein the at least one surfactant is in an amount of from about 0.0001 wt % to about 1 wt % of the composition.

23. The composition of claim 1, wherein the composition has a pH at most about 1.

24. A method, comprising:
    contacting a semiconductor substrate containing Ta or TaN with a composition of claim 1 to remove the Ta or TaN.

25. The method of claim 24, further comprising rinsing the semiconductor substrate with a rinse solvent after the contacting step.

26. The method of claim 25, further comprising drying the semiconductor substrate after the rinsing step.

27. The method of claim 24, wherein the method does not substantially remove Cu or a dielectric material on the semiconductor substrate.

\* \* \* \* \*